Oct. 22, 1974 W. KRAFT 3,843,428

METHOD OF MANUFACTURING A THERMOCOMPRESSION CONTACT

Filed July 18, 1973 2 Sheets-Sheet 1

United States Patent Office 3,843,428
Patented Oct. 22, 1974

3,843,428
METHOD OF MANUFACTURING A THERMO-COMPRESSION CONTACT
Wolfgang Kraft, Freiburg, Germany, assignor to ITT Industries, Inc., New York, N.Y.
Filed July 18, 1973, Ser. No. 380,327
Int. Cl. C23f *1/02;* H01l *7/50*
U.S. Cl. 156—7 8 Claims

ABSTRACT OF THE DISCLOSURE

This relates to a method of improving the adherence of thermocompression contacts to aluminum layers in planar sealed semiconductor devices. The aluminum layer is thermally oxidized in an atmosphere of doping components prior to the deposition of the glass layer. Contact windows are then opened by means of etching through the glass layer and the aluminum oxide.

BACKGROUND OF THE INVENTION

The invention relates to a method of manufacturing thermocompression contacts at metal layers of aluminum contacting the zones of a planar semiconductor component in a passivating layer covering the semiconductor surface, and more particularly to the manufacture of such thermocompression contacts on a metal layer of aluminum contacting the zones of a planar integrated circuit.

As is well known, such planar integrated circuits are diffused into the plane surface of a semiconductor body, especially of silicon by using planar diffusion masking, and are contacted with the aid of metal layers, in particular as already mentioned, of aluminum, embodied in conductive strips or tracks. As described in the journal "Electronics," July 12, 1965, pp. 99–105, these conductive strips are preferably led to the edge of the planar integrated circuit where they end up in contact pads with the necessary contacting area. When employing the well-known thermocompression method, these contact pads may be contacted with the aid of gold wires which, in turn, are connected to the lead-in wires, e.g. in the shape of tapes or strips, to a housing or casing. Subsequently to the manufacture of the contact pads, the surface of the planar semiconductor component may be coated with a further passivating layer which gives protection against scratches, and consists in particular of a doped $SiO_2$–glass.

For simplifying the description and for enabling a better understanding, the following description and the claims refer to the manufacture of *one* thermocompression contact on *one* metal layer of aluminum contacting the zone of a planar semiconductor component.

As the material for such a passivating layer it is suitable to use in particular a doped silicon oxide. A silicon dioxide layer doped with phosphorus for serving as the passivating layer has become known from the "IBM-Journal" (Sept. 1964), pp. 376 to 384, and from the U.S. Pat. No. 3,334,281, and is produced, for example, during the diffusion of phosphorus while manufacturing a planar semiconductor component.

It is favorable to deposit such a passivating layer out of the gas phase during the planar diffusion upon the planar diffusion masking, as well as upon the metallic conductive strips for scratch protection, because the composition of the passivating layer can be chosen extensively at will. For contacting the conductive strip in this method, subsequently to the deposition of the passivating layer, the latter is punctured down to the surface of the contacting pad for manufacturing the thermocompression contact.

This method has the disadvantage of providing a thermocompression contact which adheres poorly to the surface of the contact pad.

SUMMARY OF THE INVENTION

It is an object of the present invention to provide a method of manufacturing a thermocompression contact on a metal layer of aluminum contacting the zone of a planar semiconductor component, said layer being disposed in a passivating layer covering the surface of the semiconductor component and result in good adherence between the thermocompression contact and the surface of the contact pad.

According to a broad aspect of the invention there is provided an improved method of manufacturing a thermocompression contact on a metal layer of aluminum contacting the zone of a planar semiconductor component, said layer disposed in a passivating layer covering the surface of said semiconductor component, wherein a semiconductor substrate is provided with a masking layer having a window therein and a contacting metal layer over said masking layer and the exposed portion of said substrate, wherein the improvement comprises: providing a doped etchable layer of aluminum oxide by thermal oxidation of said contacting metal layer; depositing a passivating layer having a first window therein over said alumiume oxide layer; and removing the aluminum oxide layer beneath said first window by etching.

The invention is based on the recognition that a thermally oxidized layer of aluminum oxide is not easily etched, but that by the addition of a suitable doping component, the etchability can be varied in such a way that with respect to many etching agents which are customarily used for the etching of silicon dioxide layers, the aluminum oxide will become etchable or more easily etchable on account of the "doping." As doping components there are naturally offered those which build themselves into the aluminum oxide, hence elements of the third and/or fifth group of the Periodic System. These elements are led preferably in the form of a gaseous compound in a stream of inert gas into the reaction chamber together with or separately from the gaseous oxidation agent. As an oxidation agent it is suitable to use oxygen and/or water vapor (steam) which is transported in a stream of inert gas.

The possibility of using known etching solutions for processing the known passivating layers, also for etching the doped layer of aluminum oxide, may be still further extended in that, in addition, during the thermal oxidation of the aluminum into the layer of oxide from the gas phase, silicon is introduced as the doping component, especially from a gas phase containing silane.

The above and other objects of the present invention will be more clearly understood from the following detailed description taken in conjunction with the accompanying drawings in which:

DESCRIPTION OF THE PREFERRED EMBODIMENTS

Figure 1:
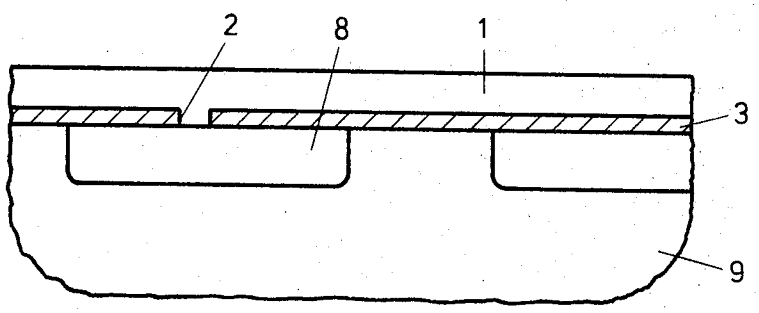
FIGS. 1–6 shows successive steps of operation of one preferred embodiment according to the invention. The drawings are cross-sectional views taken perpendicularly in relation to the surface of the semiconductor component.
Figure 2:
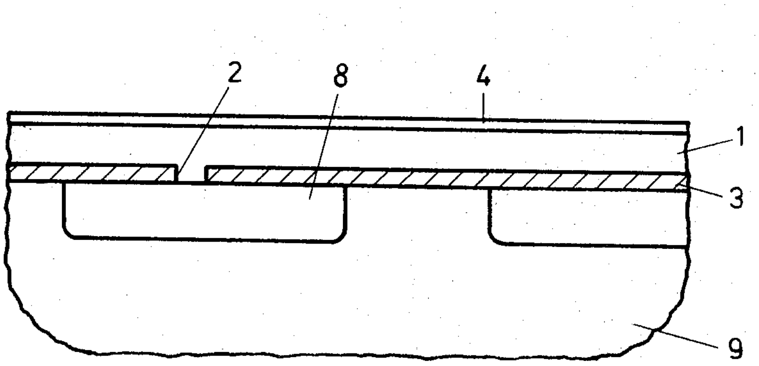

In FIG. 1 there is shown a semiconductor body 9 into which, by using the planar diffusion masking 3 as the diffusion mask for a planar diffusion process, there has been inserted a contacting zone 8. In the diffusion masking 3 there is provided a contact window 2, and the contacting metal layer 1 of aluminum is deposited upon the entire exposed surface of the semiconductor component which is then preferably subjected to a sintering or alloying process. It is advisable to roughen the aluminum surface chemically, e.g. by way of an anodic etching with about 2 v. in a $CrO_3$—$H_3PO_4$—$H_2O$ solution for some minutes at a temperature of 80°.

Figure 3:
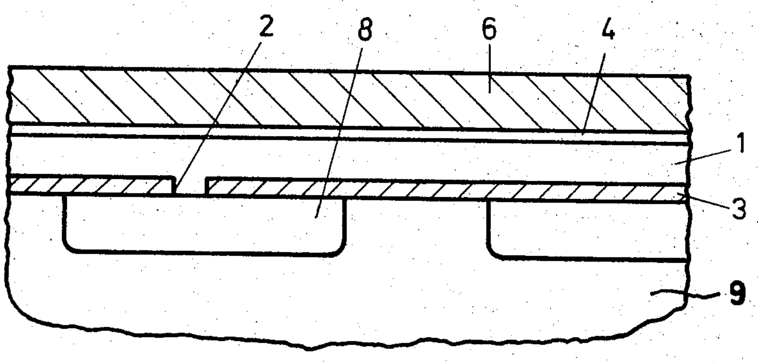

When using the method according to the invention for the manufacture of integrated (solid-state) circuits employing planar semiconductor components, the metal layer 1, prior to the thermal oxidation and prior to the application of the passivating layer 6 as explained with reference to FIG. 3, is provided with a conductive strip pattern corresponding to the circuit to be realized. For this purpose, and in the conventional manner by employing the photolithographic etch-masking process, there are removed the parts of the metal layer 1 between the conductive strip pattern.

This conductive strip pattern, in accordance with the invention, and prior to the deposition of the passivating layer, is subjected to an oxidation in a stream of oxygen. Oxidation is preferably effected in the same reactor in which the passivating layer is produced. During oxidation of the aluminum, in a manner which has already become known in connection with the deposition of epitaxial layers, and by selecting the atmosphere in the reactor, traces of $P_2O_5$ and of $SiO_2$ are built into the layer of aluminum oxide. In all experiments there was used a $O_2$-stream with a water content of at least 10 p.p.m.

Thereafter, according to FIG. 3, a passivating layer 6 consisting of phosphorus-doped silicon oxide in glass form (phosphor glass) is deposited by way of thermal decomposition from the gas phase. Such methods using a silane and a gaseous doping compound are well known in the art.

Figure 4:
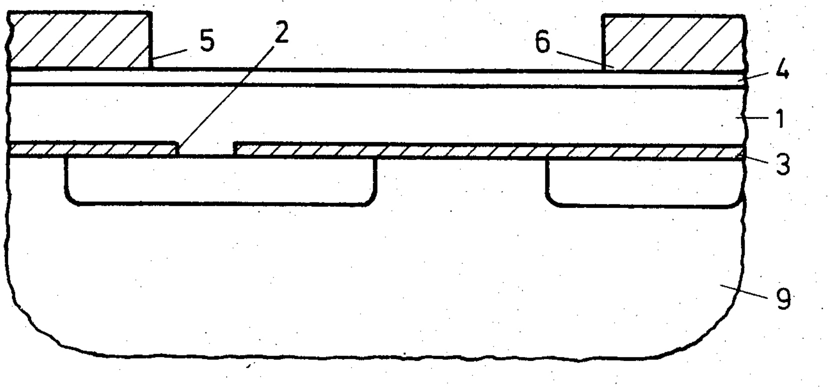
Figure 5:
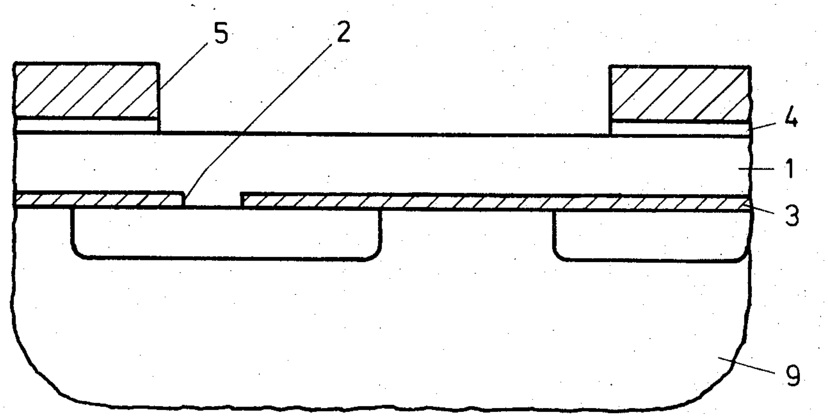

In this passivating layer 6 and according to FIG. 4, by employing a conventional etching agent, the window is now produced centrically in relation to that particular point to which the thermocompression contact is to be attached. By extending the etching time, the doped aluminum oxide layer 4 is removed as well within the window 5 according to FIG. 5. Accordingly, the inventive method makes it possible to employ the same etching agent which is known to be used for etching a passivating layer, for etching the aluminum oxide layer produced by way of thermal oxidation but which is doped according to the invention. In the course of this, however, there is maintained the protective effect of the doped aluminum oxide layer during the application (deposition) of the passivating layer having a substantially higher content of silicon than the doped layer of aluminum oxide. In this way, by making simple tests, most of the conventional etching agents can be made suitable for etching a thermally oxidized layer of aluminum oxide, i.e. simply by varying both the amount and the kind of doping components.

Removal of the doped aluminum oxide layer 4 within the window 5 of the pasivating layer 6 may also be carried out by way of anodic etching from the gas phase by stimualting an electroless glow discharge in an atmosphere containing the gaseous etching agent. In the course of this, the passivating layer 6 serves at the etch masking.

Figure 6:
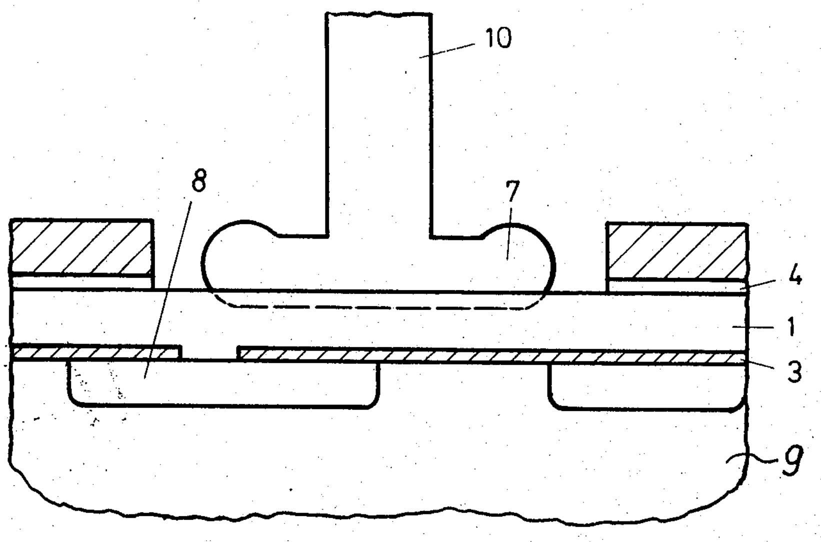

Finally, after having exposed the metal layer 1, and in the usual way by employing a gold wire with a nail-head-like end, there is established the thermocompression contact (connection) between the flattened head 7 and the metal layer 1 within the window 5 as shown in FIG. 6.

Apart from the substantially improved protection of the metal layer as compared to conventional arrangements and methods, a thermocompression contact is obtainable by using the method according to the invention which adheres particularly well to the metal layer of aluminum. This is deemed to be due to the effect of the doped aluminum oxide layer 4 protecting the metal layer 1 during the application of the passivating layer 6 from being thermally decomposed out of the gas phase. Moreover, it was found that the roughening of the surface as carried out prior to the thermal oxidation, noticeably improves the adherence of the thermocompression contact to aluminum layers.

It is to be understood that the foregoing description of specific examples of this invention is made by way of example only and is not to be considered as a limitation on its scope.

What is claim is:

1. An improved method of manufacturing a thermocompression contact on a metal layer of aluminum contacting the zone of a planar semiconductor component, said layer disposed in a passivating layer covering the surface of said semiconductor component, wherein a semiconductor substrate is provided with a masking layer having a window therein and a contacting metal layer over said masking layer and the exposed portion of said substrate, wherein the improvement comprises:
   - providing a doped etchable layer of aluminum oxide by thermal oxidation of said contacting metal layer;
   - depositing a passivating layer having a first window therein over said aluminum oxide layer; and
   - removing the aluminum oxide layer beneath said first window by etching.
2. A method according to claim 1 wherein said aluminum oxide layer is doped with elements of the third group of the Periodic System.
3. A method according to claim 1 wherein said aluminum oxide layer is doped with elements of the fifth group of the Periodic System.
4. A method according to claim 1 wherein said aluminum oxide layer is doped with silicon by oxidation in the presence of $P_2O_5$ and of a gaseous silicon compound in an $O_2$-stream.
5. A method according to claim 1 wherein said metal layer, prior to said thermal oxidation, is subjected to an anodic etching for roughening the surface of said aluminum.
6. A method according to claim 1 wherein said passivating layer is deposited by way of thermal decomposition from the gas phase.
7. A method according to claim 6 wherein said passivating layer is silicon oxide doped with phosphorus.
8. A method according to claim 1 wherein said doped aluminum oxide layer is removed within said first window of said passivating layer by being etched from the gas phase.

References Cited

UNITED STATES PATENTS

| | | | |
|---|---|---|---|
| 3,365,793 | 1/1968 | Nechtow | 156—17 X |
| 3,523,223 | 8/1970 | Luxem et al. | 317—234 |
| 3,571,914 | 3/1971 | Lands et al. | 29—571 |
| 3,699,011 | 10/1972 | Takeo Nishimura | 204—15 |

WILLIAM A. POWELL, Primary Examiner

U.S. Cl. X.R.

29—576; 148—180, 187; 156—17, 22; 317—234

UNITED STATES PATENT OFFICE

CERTIFICATE OF CORRECTION

Patent No. 3,843,428 Dated October 22, 1974

Inventor(s) Wolfgang Kraft

It is certified that error appears in the above-identified patent and that said Letters Patent are hereby corrected as shown below:

After "Filed July 18, 1973, Ser. No. 380,327"

Add --Claims Priority, Germany September 1, 1972 ... P 22 43 011.1--

Signed and Sealed this

*thirtieth* Day of *September 1975*

[SEAL]

*Attest:*

RUTH C. MASON
*Attesting Officer*

C. MARSHALL DANN
*Commissioner of Patents and Trademarks*